(12) United States Patent
Kim et al.

(10) Patent No.: US 11,600,608 B2
(45) Date of Patent: Mar. 7, 2023

(54) SEMICONDUCTOR PACKAGE

(71) Applicant: SAMSUNG ELECTRONICS CO., LTD., Suwon-si (KR)

(72) Inventors: Jichul Kim, Seoul (KR); Chajea Jo, Yongin-si (KR); Sang-Uk Han, Hwaseong-si (KR); Kyoung Soon Cho, Yeonsu-Gu (KR); Jae Choon Kim, Yeonsu-Gu (KR); Woohyun Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 154 days.

(21) Appl. No.: 17/204,225

(22) Filed: Mar. 17, 2021

(65) Prior Publication Data

US 2021/0202462 A1 Jul. 1, 2021

Related U.S. Application Data

(63) Continuation of application No. 16/503,121, filed on Jul. 3, 2019, which is a continuation of application
(Continued)

(30) Foreign Application Priority Data

Apr. 18, 2017 (KR) .................. 10-2017-0049704

(51) Int. Cl.
*H01L 25/18* (2006.01)
*H01L 27/146* (2006.01)
*H01L 23/00* (2006.01)
*H01L 25/00* (2006.01)
*H01L 23/367* (2006.01)
(Continued)

(52) U.S. Cl.
CPC ............ *H01L 25/18* (2013.01); *H01L 21/561* (2013.01); *H01L 21/568* (2013.01); *H01L 23/3121* (2013.01); *H01L 23/367* (2013.01); *H01L 24/16* (2013.01); *H01L 24/48* (2013.01); *H01L 25/0655* (2013.01); *H01L 25/50* (2013.01); *H01L 27/14618* (2013.01); *H01L 27/14634* (2013.01); *H01L 27/14636* (2013.01); *H01L 23/18* (2013.01); *H01L 2224/16145* (2013.01); *H01L 2224/16225* (2013.01);
(Continued)

(58) Field of Classification Search
CPC ... H01L 25/50; H01L 25/0652; H01L 25/071; H01L 25/112
See application file for complete search history.

(56) References Cited

U.S. PATENT DOCUMENTS 7,701,044 B2 4/2010 Kang et al.
8,801,304 B2 8/2014 Sekine
(Continued)

FOREIGN PATENT DOCUMENTS

JP 2016134587 A 7/2016
JP 2016171297 A 9/2016

*Primary Examiner* — Tucker J Wright
(74) *Attorney, Agent, or Firm* — Volentine, Whitt & Francos, PLLC

(57) ABSTRACT

A semiconductor package includes a first semiconductor chip on a substrate, a second semiconductor chip on the substrate and spaced apart from the first semiconductor device, a mold layer on the substrate and covering sides of the first and second semiconductor chips, and an image sensor unit on the first and second semiconductor chips and the mold layer. The image sensor unit is electrically connected to the first semiconductor chip.

20 Claims, 10 Drawing Sheets

Related U.S. Application Data

No. 15/786,698, filed on Oct. 18, 2017, now Pat. No. 10,510,737.

(51) Int. Cl.
*H01L 21/56* (2006.01)
*H01L 23/31* (2006.01)
*H01L 25/065* (2023.01)
*H01L 23/18* (2006.01)

(52) U.S. Cl.
CPC ............... *H01L 2224/16265* (2013.01); *H01L 2224/48227* (2013.01); *H01L 2924/00014* (2013.01)

(56) References Cited

U.S. PATENT DOCUMENTS

| | | |
|---|---|---|
| 9,305,962 B2 | 4/2016 | Chen et al. |
| 9,431,450 B2 | 8/2016 | Umebayashi et al. |
| 9,607,971 B2 | 3/2017 | Asayama et al. |
| 9,666,626 B2 | 5/2017 | Kishi |
| 2003/0234886 A1 | 12/2003 | Cho et al. |
| 2004/0166763 A1 | 8/2004 | Hanada et al. |
| 2008/0073742 A1 | 3/2008 | Adkisson et al. |
| 2008/0093721 A1 | 4/2008 | Kang et al. |
| 2008/0308928 A1 | 12/2008 | Chang et al. |
| 2012/0281113 A1 | 11/2012 | Kennedy et al. |
| 2016/0233261 A1 | 8/2016 | Hsu et al. |
| 2016/0315071 A1 | 10/2016 | Zhai |

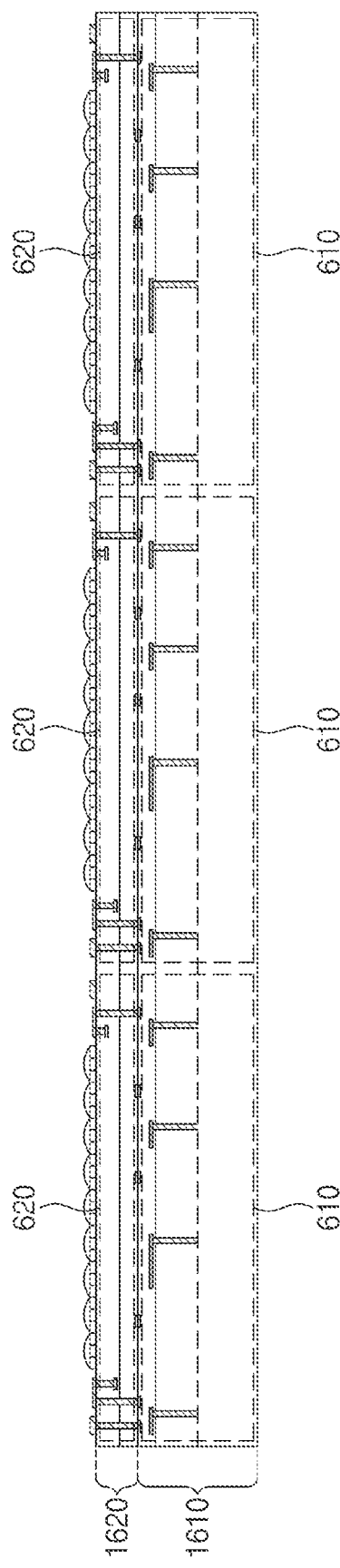
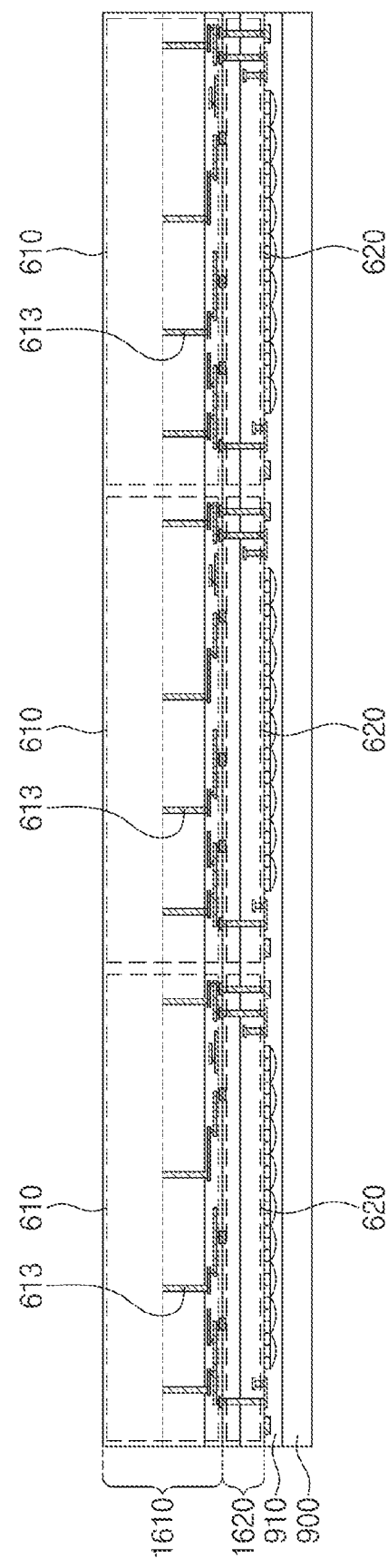

SEMICONDUCTOR PACKAGE

PRIORITY STATEMENT

This is a Continuation of U.S. application Ser. No. 16/503,121, filed Jul. 3, 2019, which is a Continuation of U.S. application Ser. No. 15/786,698, filed Oct. 18, 2017, which claims priority under 35 U.S.C. § 119 to Korean Patent Application No. 10-2017-0049704 filed on Apr. 18, 2017, in the Korean Intellectual Property Office, the disclosure of which is hereby incorporated by reference in its entirety.

BACKGROUND

1. Field

The inventive concept relates to a semiconductor package and to a method of manufacturing the same. More specifically, the inventive concept relates to a stacked CMOS semiconductor package.

2. Description of Related Art

In general, an electronic image sensor is a semiconductor-based device that converts an optical image into an electrical signal. Such an electronic image sensor can be mainly classified as a charge coupled device (CCD) or a complementary metal oxide silicon (CMOS) image sensor (CIS). Both of these types of image sensors have been used in digital cameras, camcorders, personal computers and surveillance cameras.

However, a CCD image sensor has various disadvantages, such as a complicated driving method and high power consumption and a complicated fabricating process entailing a multi-step photolithography process.

SUMMARY

According to an aspect of the inventive concept, there is provided a semiconductor package including a substrate, a first semiconductor chip on the substrate, a second semiconductor chip on the substrate and spaced laterally apart from the first semiconductor chip, a mold layer on the substrate and covering sides of the first and second semiconductor chips, and an image sensor unit on the first and second semiconductor chips and the mold layer, and in which the image sensor unit comprises an electronic image sensor electrically connected to the first semiconductor chip.

According to another aspect of the inventive concept, there is provided a semiconductor package including an image sensor unit having opposite major first and second surfaces, pixel regions at the major second surface thereof and a photodiodes operatively associated with the pixel regions to sense light incident on the pixel regions, a first lower semiconductor chip and a second lower semiconductor chip on the major first surface of the image sensor unit, a mold layer on the major first surface of the image sensor unit and covering sides of the first and second lower semiconductor chips; and a connection terminal interposed between the major first surface of the image sensor unit and the first lower semiconductor chip and electrically connecting the first lower semiconductor chip to the image sensor unit. A sum of widths of the first and second lower semiconductor chips is smaller than a width of the image sensor unit, the widths being dimensions taken in a direction parallel to the major first and second surfaces of the image sensor unit.

According to yet another aspect of the inventive concept, there is provided a semiconductor package including a substrate, a first chip disposed on the substrate, a second chip disposed on the substrate as laterally spaced from the first chip in a first direction, a mold layer encapsulating the first and second chips on the substrate, a third chip disposed on the mold layer and overlying the first and second chips in their entirety, and an array of pixels disposed on the logic chip. The first chip is a memory chip, the second chip is an active chip, a passive chip, or a dummy chip, and the third chip is a logic chip electrically connected to the array of pixels and to the memory chip.

BRIEF DESCRIPTION OF THE DRAWINGS

FIGS. 10, 11, 12, 13 and 14 are cross-sectional views of an article of mass-manufacture and together illustrating a mass production method of manufacturing a semiconductor package according to the inventive concept.

DETAILED DESCRIPTION

Various examples of the inventive concept will now be described more fully with reference to the accompanying drawings. However, the inventive concept may be embodied in many alternate forms and should not be construed as limited to only the examples described hereinafter.

Figure 1:
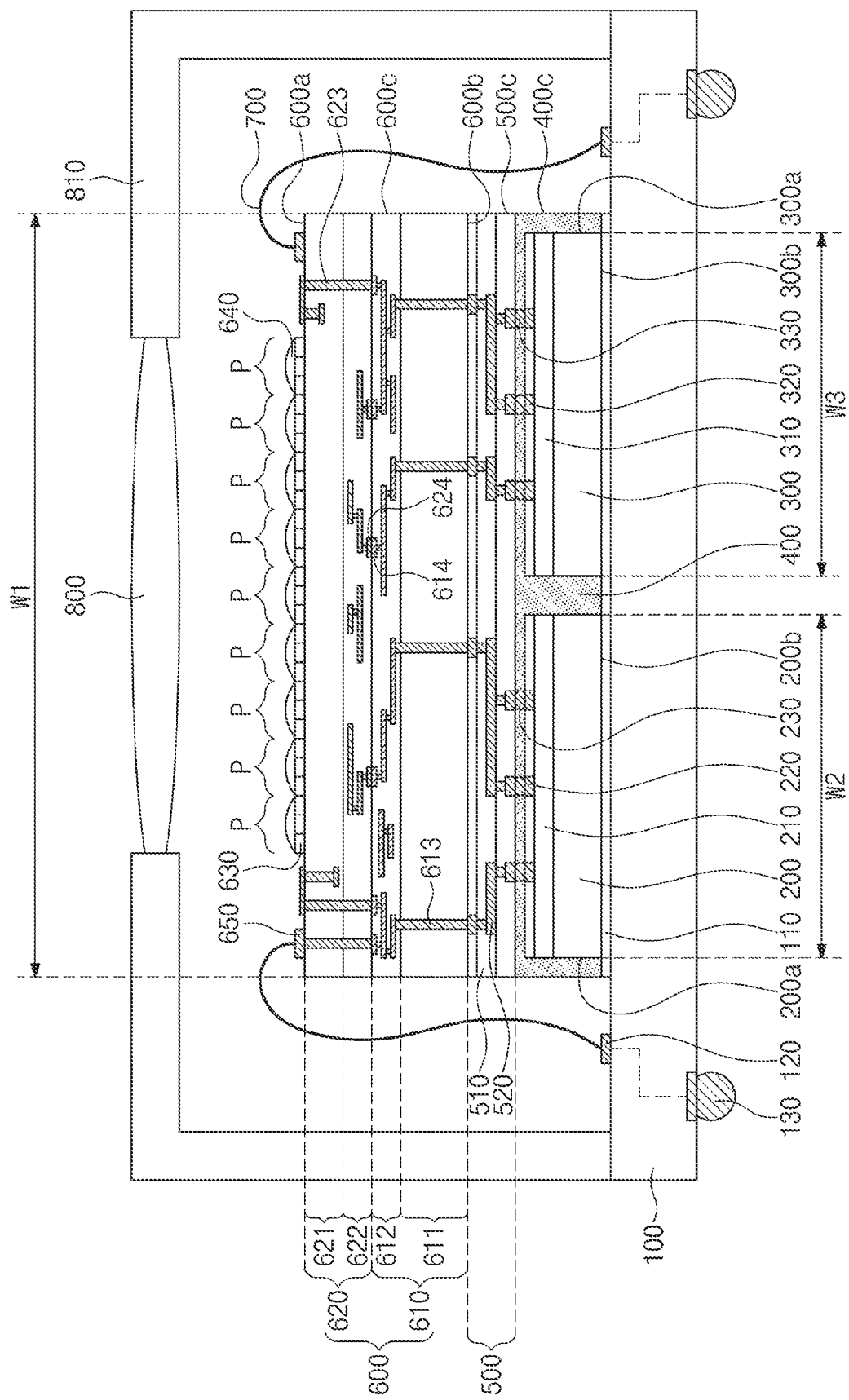
FIG. 1 is a cross-sectional view of an example of a semiconductor package according to the inventive concept.

FIG. 1 is a cross-sectional view illustrating an example of a semiconductor device according to the inventive concept. In the following drawings, the illustration of interconnection patterns and integrated circuit elements in a semiconductor chip will be omitted or abbreviated for the sake of clarity. Also, in the description that follows, reference may be made to a single element (e.g. a pad) or feature (e.g., a surface) for simplicity even though examples, as may be illustrated in the drawings, have multiple ones of the same type of element or feature to which the same description obviously applies.

Referring to FIG. 1, a substrate 100 may be provided. The substrate 100 may include, for example, a printed circuit board (PCB). The substrate 100 may include a substrate pad 120 and an external terminal 130. The substrate pad 120 may be disposed on an upper surface of a body of the substrate 100. The external terminal 130 may include a solder ball or a solder bump. The external terminal 130 may be electrically connected to the substrate pad 120 via the substrate 100 as illustrated by the dashed line. The electrical connection may be a direct (no intervening active or passive electronic components) or indirect electrical connection.

A first semiconductor chip 200 may be provided on the substrate 100. The first semiconductor chip 200 may be a memory chip such as a DRAM, SRAM, MRAM or flash memory. The first semiconductor chip 200 may be a silicon-based chip. An upper surface of the first semiconductor chip 200 may be an active surface. For example, the first semiconductor chip 200 may include a first conductive pattern 210 and a first chip pad 220 provided at an upper portion thereof. The first chip pad 220 may be electrically connected to at least one integrated circuit element or integrated circuits of or constituted by the first conductive pattern 210.

A second semiconductor chip 300 may be provided on the substrate 100. The second semiconductor chip 300 may be laterally spaced apart from the first semiconductor chip 200, e.g., the first and second semiconductor chips 200 and 300 may be disposed side-by-side. The second semiconductor chip 300 may have a single layer structure, i.e., may consist of a single material (in the case of a dummy chip described in more detail below) or may have a multi-layered structure of different materials. Especially in the case in which the second semiconductor chip 300 has a single layer structure, the second semiconductor chip 300 may include silicon, such as polysilicon, or metal.

In some examples, the second semiconductor chip 300 is a memory chip, a logic chip, a capacitor or a hybrid chip configured as a combination thereof. In these examples, the second semiconductor chip 300 may be a silicon-based chip. An upper surface of the second semiconductor chip 300 may be an active surface. For example, the second semiconductor chip 300 may include a second conductive pattern 310 and a second chip pad 320 provided at an upper portion thereof. The second chip pad 320 may be electrically connected to an integrated circuit (IC) constituted by the second conductive pattern 310. In examples in which the second semiconductor chip 300 is a memory chip, a logic chip, or a hybrid chip, the second semiconductor chip 300 is considered to be an active chip as it includes an IC, i.e., an active electronic component. In examples in which the second semiconductor chip 300 is a capacitor, i.e., a chip capacitor, the second semiconductor chip 300 is considered to be a passive chip as it includes a passive electronic component and no active electronic components.

In some examples in which the second semiconductor chip 300 is a dummy chip, the second conductive pattern 310 and the second chip pad 320 are omitted and the chip is electrically isolated in the package. Here, the term "chip" is used to merely refer to the fact that the body, such as the single layer of material, which occupies the space next to the first semiconductor chip 200 in the mold layer 400 beneath the third semiconductor chip 610. The term "dummy" as is well known in the art refers to the fact that the component has no electronic function in the package. Thus, "dummy chip" as used herein refers to a body of material(s) having a size and shape similar to that of a standard active chip, such as a memory chip, or passive chip but which does not perform an electronic operation in the package.

The first and second semiconductor chips 200 and 300 may be attached to the substrate 100. To this end, a substrate adhesion layer 110 may be interposed between the first and second semiconductor chips 200 and 300 and the substrate 100.

A mold layer 400 may be provided on the substrate 100. The mold layer 400 may cover the first and second semiconductor chips 200 and 300. Sides 200a and 300a of the first and second semiconductor chips 200 and 300 may be covered by the mold layer 400 so as not to be exposed to an external environment. The mold layer 400 may fill a space between the first semiconductor chip 200 and the second semiconductor chip 300. The mold layer 400 may not cover lower surfaces of the first and second semiconductor chips 200 and 300. The mold layer 400 may expose the first chip pad 220 of the first semiconductor chip 200 and the second chip pad 320 of the second semiconductor chip 300. The mold layer 400 may prevent the first and second semiconductor chips 200 and 300 from being damaged by external impact, moisture or the like. The mold layer 400 may include an insulating polymer such as an epoxy mold compound. The mold layer 400 may have a lower thermal conductivity than the substrate 100 and the first and second semiconductor chips 200 and 300. Because the mold layer 400 does not cover the lower surfaces of the first and second semiconductor chips 200 and 300, heat generated from the first and second semiconductor chips 200 and 300 may be dissipated to the outside of the semiconductor package through the substrate 100, during operation of the semiconductor package.

An image sensor unit 600 unit may be disposed over the mold layer 400. A width W1 of the image sensor unit 600 may be greater than a width W2 of the first semiconductor chip 200 and a width of the second semiconductor chip W3. The width W1 of the image sensor unit 600 may be greater than a sum of the width W2 of the first semiconductor chip 200 and the width W3 of the second semiconductor chip 300. In plan view, the image sensor unit 600 may overlap the entirety of the first semiconductor chip 200 and the second semiconductor chip 300. In general, the third semiconductor chip 610 lies over the entirety of the first and second chips 200 and 300 at least in the direction in which the first and second chips 200 and 300 are laterally spaced from each other.

The image sensor unit 600 may have an upper major surface 600a and a lower major surface 600b. The upper surface 600a of the image sensor unit 600 may be a light incident surface, i.e. a surface dedicated to receive incident light during operation. The lower surface 600b of the image sensor unit 600 may face toward the first and second semiconductor chips 200 and 300. In some examples, an adhesion layer is provided between the lower surface 600b of the image sensor unit 600 and the first and second semiconductor chips 200 and 300. The lower surface 600b of the image sensor unit 600 may be firmly attached to the first and second semiconductor chips 200 and 300 by the adhesion layer. A side (or side "surface") 600c of the image sensor unit 600 may be substantially coplanar with a side (or side "surface") 400c of the mold layer 400. The image sensor unit 600 may be supported over its entire bottom surface by the mold layer 400. Thus, the image sensor unit 600 may be stably supported in the package by virtue of the first and second semiconductor chips 200 and 300 and the mold layer 400. The image sensor unit 600 may sense the light that is incident on the upper surface 600a and may output the sensed light as an electrical signal. To this end, the image sensor unit may have a microprocessor and an array of pixels on the microprocessor, as will be described in more detail below.

The image sensor unit 600 may include a third semiconductor chip 610 and a sensing chip 620 either or both of which may be considered as constituting an electronic image sensor. The sensing chip 620 may include photodiodes converting light into electric charges. The third semiconductor chip 610 may be a logic chip converting (i.e., processing) the electric charges generated by the sensing chip 620 into an electrical signal representative of an image(s).

The third semiconductor chip 610 may include a first base layer 611, a first circuit layer 612, a first via 613 and a first bonding pad 614. The first base layer 611 may include a silicon substrate. The first circuit layer 612 may be provided on the first base layer 611. The first circuit layer 612 may include integrated circuits (e.g., transistors) and at least one interconnection pattern. The first via 613 may penetrate the first base layer 611 and may electrically connect the first circuit layer 612 to the first semiconductor chip 200 and/or the second semiconductor chip 300. Thus, an electrical path between the first and/or second semiconductor chips 200 and 300 and the third semiconductor chip 610 may be relatively short. The first bonding pad 614 may be disposed on an upper surface of the third semiconductor chip 610. The upper surface of the third semiconductor chip 610 may be an active surface.

The sensing chip 620 may be disposed on the third semiconductor chip 610. The sensing chip 620 may include a second base layer 621, a second circuit layer 622, a second via 623 and a second bonding pad 624. The second base layer 621 may include a silicon substrate. The second circuit layer 622 may be provided at a lower portion of the sensing chip 620, adjacent to the third semiconductor chip 610. The second circuit layer 622 may include an integrated circuit of photodiodes (including photodiodes and transistors) and at least one interconnection pattern. The at least one transistor may constitute a CMOS. The second bonding pad 624 may be disposed on a lower surface of the sensing chip 620. The lower surface of the sensing chip 620 may be an active surface. The second bonding pad 624 may contact the first bonding pad 614. Thus, the sensing chip 620 may be electrically connected to the third semiconductor chip 610 by the first and second bonding pads 614 and 624. The second via 623 may extend through at least a part of the sensing chip 620. In some examples, the second via 623 extends through the sensing chip 620 to be electrically connected to the third semiconductor chip 610. In other examples, the second via 623 extends partially through the sensing chip 620 and is electrically connected to the third semiconductor chip 610.

A pixel array region may be provided at an upper portion of the image sensor unit 600. The pixel array region may include pixel regions P (e.g., including the photodiodes and the transistors) in the sensing chip 620. In a plan view, the pixel regions P may be disposed in a central region of the image sensor unit 600. Color filters 630 and micro-lenses 640 may be disposed on the upper surface 600a of the image sensor unit 600 and may be provided to the pixel regions P. The pixel regions P may constitute an array of pixels.

A connection pad 650 may be disposed on the upper surface 600a of the image sensor unit 600. The connection pad 650 may be disposed on the upper surface 600a of an edge portion of the image sensor unit 600. In a plan view, the connection pad 650 may be spaced apart from the pixel array region. The connection pad 650 may be electrically connected to the second via 623 of the sensing chip 620. The connection pad 650 may be connected to the substrate pad 120, i.e., a terminal of the substrate 100, via a bonding wire 700. The image sensor unit 600 may be electrically connected to the substrate 100 via the bonding wire 700.

In some examples, a redistribution layer 500 is provided between the image sensor unit 600 and the first and second semiconductor chips 200 and 300. The redistribution layer 500 may extend between the mold layer 400 and the image sensor unit 600. In some examples, an adhesion layer may be provided between the redistribution layer 500 and the first and second semiconductor chips 200 and 300 such that the redistribution layer 500 and the first and second semiconductor chips 200 and 300 may be securely bonded. The redistribution layer 500 may include insulating layers 510 and a redistribution (wiring) pattern 520. The redistribution pattern 520 may include at least one conductive layer and conductive vias. The redistribution layer 500 may be electrically connected to the third semiconductor chip 610. The first semiconductor chip 200 may be electrically connected to the redistribution layer 500 by a first connection terminal 230 provided therebetween. The second semiconductor chip 300 may be electrically connected to the redistribution layer 500 by a second connection terminal 330 provided therebetween. The redistribution layer 500 may allow for increased freedom in the arranging of the first and second semiconductor chips 200 and 300. In some examples, the second semiconductor chip 300 is not electrically connected to the redistribution layer 500.

A holder 810 may be provided on the substrate 100 and may support a lens 800. That is the lens 800 may be disposed on the holder 810. The lens 800 may be spaced apart from the image sensor unit 600 to face the image sensor unit 600. The lens 800 may focus light on the incident surface of the image sensor unit 600.

A semiconductor package according to any of the examples described above may have improved heat dissipation efficiency.

Figure 2:
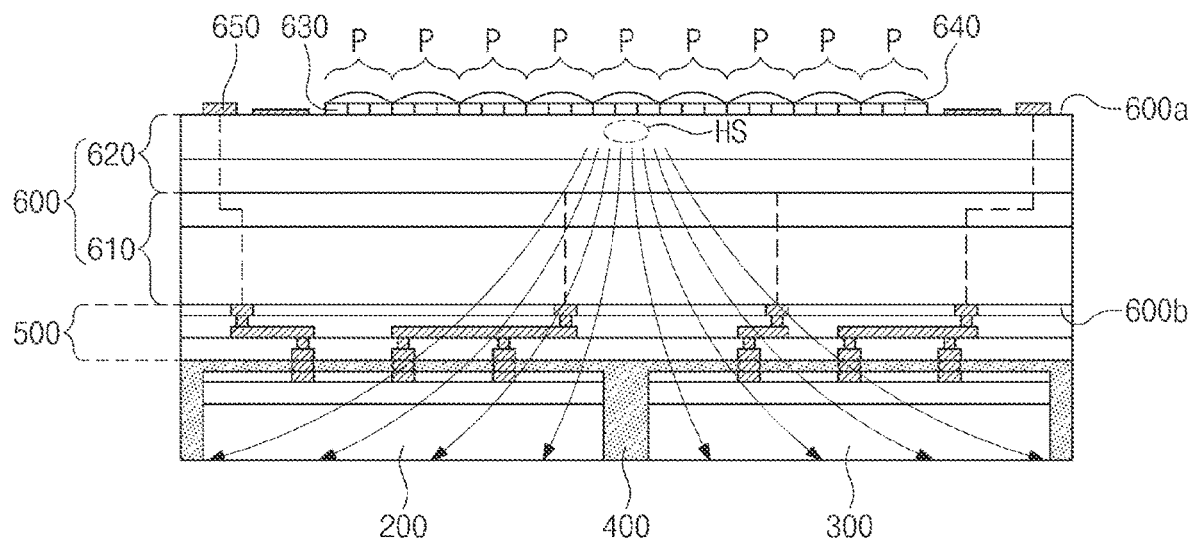
FIGS. 2 and 3 are partial cross-sectional views of the semiconductor package of FIG. 1 illustrating heat transfer in the package.
Figure 3:
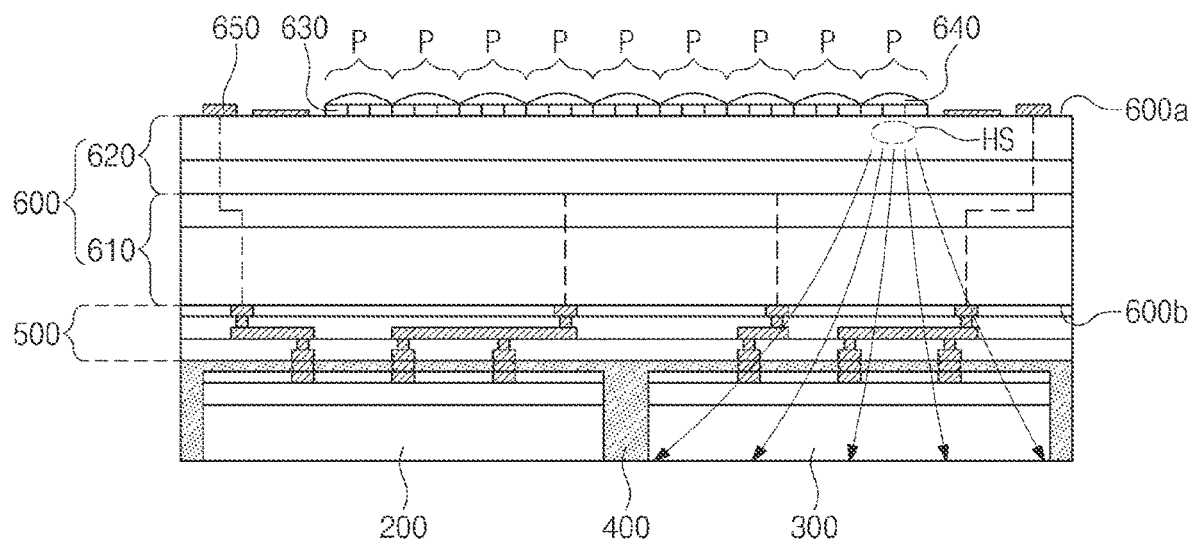

FIGS. 2 and 3 illustrate heat transfer in a semiconductor package according to the inventive concept. In FIGS. 2 and 3, some of the elements described above are omitted for clarity.

Referring to FIG. 2, a heat source HS at which heat is generated and accumulates in the image sensor unit 600 during operation is depicted. The heat source HS may not be limited to the location shown in FIG. 2. For example, the heat source HS may be present at various locations in the third semiconductor chip 610 and the sensing chip 620. While the image sensor unit 600 operates, heat has the potential to transfer from the location of the heat source HS toward the upper surface 600a of the image sensor unit 600. In the case in which such a heat transfer occurs, noise such as dark current may be generated in the pixel regions P due to the heat.

If the second semiconductor chip 300, even as a dummy chip, were not provided in a space below the image sensor unit 600, that same space below the image sensor unit 600 would be filled with a mold layer 400. The mold layer 400 typically has a relatively low thermal conductivity of, for example, 0.88 W/mK. Thus, the heat generated at the heat source HS in the image sensor unit 600 would not dissipate through the mold layer 400.

In contrast, in examples of a semiconductor package according to the inventive concept, the second semiconductor chip 300 is disposed in what would otherwise be extra space below the image sensor unit 600. The second semiconductor chip 300 may include metal or silicon having a higher thermal conductivity than the mold layer 400. The heat conductivity of the silicon may be 149 W/mK, for example. Because a portion of the mold layer 400 below the image sensor unit 600 is essentially replaced by the second semiconductor chip 300 heat dissipation efficiency of the semiconductor package is improved.

According to an aspect of the inventive concept shown in FIG. 3, the heat dissipation efficiency of the semiconductor package is not particularly dependent on the location of the heat source HS. Consider a case in which heat is generated at a heat source HS located adjacent to an edge (outer peripheral portion) of the image sensor unit 600. An area in which the image sensor unit 600 overlaps the first and second semiconductor chips 200 and 300 is relatively large compared to the case in which the image sensor unit 600 overlaps only one chip (i.e., the case in which the second semiconductor chip 300 were not provided). The heat generated at the location of the heat source HS may more easily dissipate to the outside of the semiconductor package in the former case, i.e., through the first and second semiconductor chips 200 and 300 according to the inventive concept, compared to the latter case in which the second semiconductor chip 300 were not provided. Even in the case in which heat is being generated at heat sources HS at various locations of the image sensor unit 600, the heat may easily dissipate to the outside of the semiconductor package through the first semiconductor chip 200 and the second semiconductor chip 300.

Additionally, the semiconductor package may not include an additional interposer or additional connection terminals (e.g., bonding wires or solder balls) for electrically connecting the first and second semiconductor chips 200 and 300 and the image sensor unit 600 but may include a plate-shaped substrate (e.g., the redistribution layer 500) for electrically connecting the first and second semiconductor chips 200 and 300 and the image sensor unit 600. Thus, a thickness of a portion of the semiconductor package below the image sensor unit 600 may be minimized such that a dimension or size of the semiconductor package may be kept correspondingly small so that the heat dissipation toward an underside of the semiconductor package may be facilitated.

The semiconductor package may dissipate the heat through the first and second semiconductor chips 200 and 300 so that the heat may be prevented from being transmitted to the pixel regions P. Thus, noise may be prevented from occurring in the image sensor unit 600 by the heat and image quality of the image sensor unit 600 may be improved.

In addition, in examples in which the second semiconductor chip 300 is an active chip, the semiconductor package may have an enhanced performance. For example, the second semiconductor chip 300 may be a memory chip to increase a memory capacity of the semiconductor package. In some examples, the second semiconductor chip 300 may be a logic chip or include a capacitor (e.g., the second semiconductor chip 300 may be a chip capacitor) to improve power efficiency or signal transmission characteristics of the semiconductor package. In some examples, the second semiconductor chip 300 may include a module of chips of the more than one of the above-mounted types mounted together independently of the package.

In some examples, the second semiconductor chip 300 may include a portion of the logic circuitry for controlling the operation of the package. Thus, a dimension or size of the image sensor unit 600 may be minimized such that a relatively compact semiconductor package may be realized.

FIGS. 4 to 9 illustrate an example of a method of manufacturing a semiconductor package, such as the package described above, according to the inventive concept. Some of the same elements as those of the above-described package are omitted in FIGS. 4-9 and are not described in detail for the sake of brevity. Hereinafter, reference to the part of the package including the upper and lower surfaces of the first and second semiconductor chips 200 and 300, the redistribution layer 500 and the image sensor unit 600 may be ad with respect to FIG. 1

Figure 4:
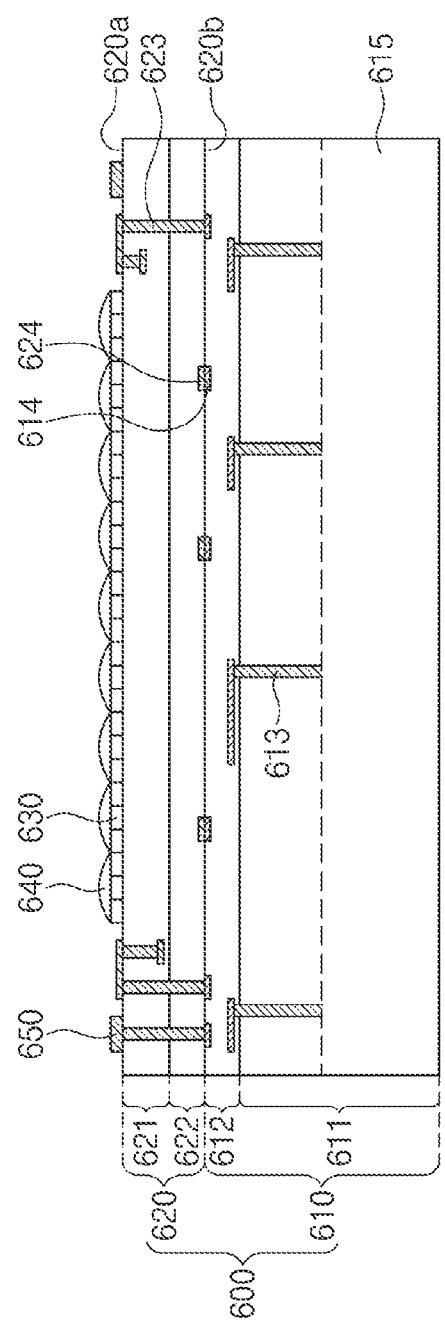
FIGS. 4, 5, 6, 7, 8 and 9 are cross-sectional views of a semiconductor package during the course of its manufacture and together illustrating a method of manufacturing a semiconductor package according to the inventive concept.

Referring to FIG. 4, the image sensor unit 600 may be provided. For example, the third semiconductor chip 610 may be bonded to a lower surface 620b of the sensing chip 620 to form the image sensor unit 600.

The sensing chip 620 may be manufactured by forming the second circuit layer 622, forming the second bonding pad 624 on the second base layer 621, and forming the second via 623 in the second base layer 621. The color filters 630, the micro-lenses 640 and the connection pad 650 may be provided on an upper surface 620a of the sensing chip 620 (e.g., an upper surface of the second base layer 621). The third semiconductor chip 610 may be formed by forming the first circuit layer 612 and the first bonding pad 614 on the first base layer 611 and forming the first via in the first base layer 611. The first and second bonding pads 614 and 624 include a conductive material such as metal.

Next, the sensing chip 620 and the third semiconductor chip 610 may be bonded to each other. The sensing chip 620 and the third semiconductor chip 610 may be bonded by a direct bonding process. For example, the process of bonding the sensing chip 620 and the third semiconductor chip 610 may include providing the sensing chip 620 on the third semiconductor chip 610 in such a way in which the second bonding pad 624 are aligned with the first bonding pad 614, performing a heat treatment process on the sensing chip 620 and the third semiconductor chip 610 to bond the first and second bonding pads 614 and 624, such that the third semiconductor chip 610 and the sensing chip 620 are bonded and electrically connected to each other. In some examples in which the third semiconductor chip 610 and the sensing chip 620 include silicon, an interface between the third semiconductor chip 610 and the sensing chip 620 may be nitrified or oxidized during the heat treatment process such that the third semiconductor chip 610 and the sensing chip 620 may be bonded to each other.

Figure 5:
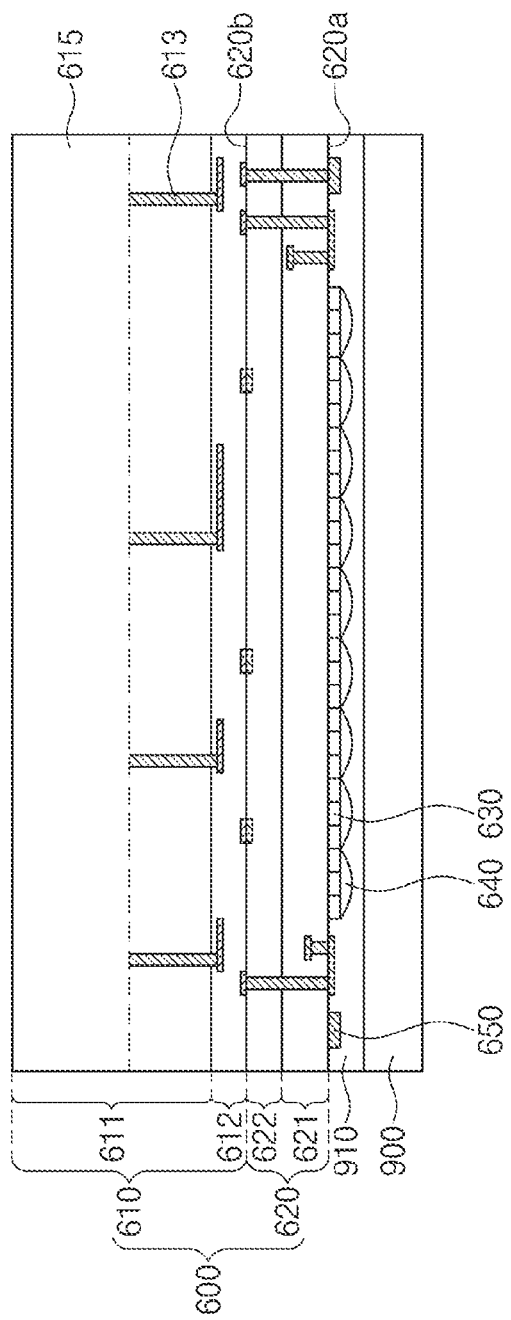

Referring to FIG. 5, the image sensor unit 600 may be provided on a carrier substrate 900. The upper surface 620a of the sensing chip 620 may face toward the carrier substrate 900. The image sensor unit 600 may be attached to the carrier substrate 900 by a carrier adhesion layer 910.

Subsequently, a portion 615 of the third semiconductor chip 610 may be removed. For example, the first base layer 611 may be thinned to expose the first via 613. For example, a grinding process may be performed on a surface of the first base layer 611 that is remote from and opposite to the lower surface 620b of the sensing chip 620

Figure 6:
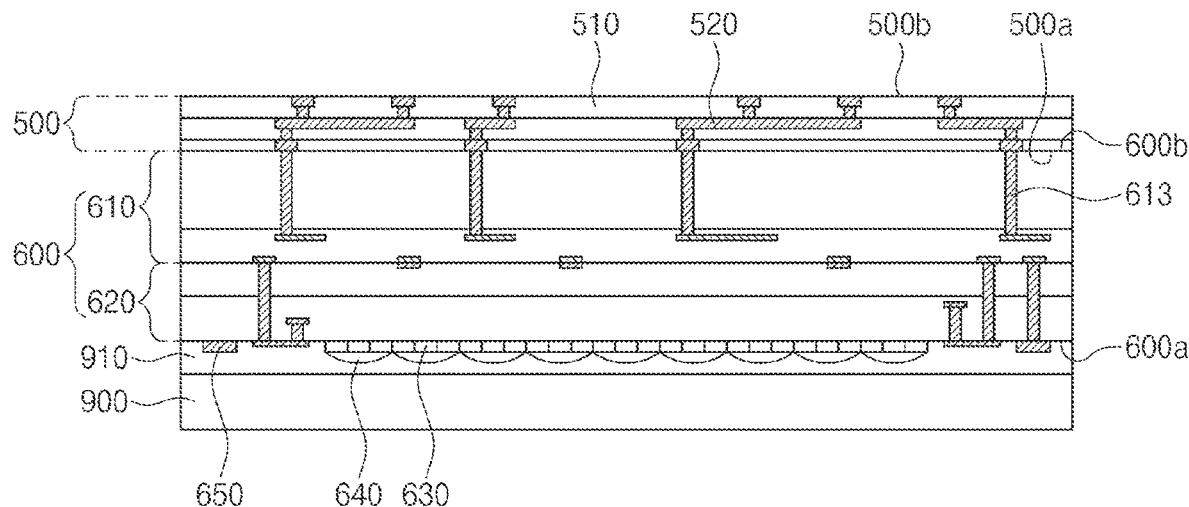

Referring to FIG. 6, the redistribution layer 500 may be formed on a lower surface 600b of the image sensor unit 600. A surface of the third semiconductor chip 610 that is exposed after the removal of the portion 615 thereof may be referred to as the lower surface 600b of the image sensor unit 600 and another surface of the image sensor unit 600 opposite to the lower surface 600b thereof may be referred to as an upper surface 600a thereof. The forming of the redistribution layer 500 may including forming the insulating layers 510 and the redistribution pattern 520 on the third semiconductor chip 610. The redistribution pattern 520 may be electrically connected to the first via 613. The redistribution pattern 520 may have various shapes depending on a location of the first and second semiconductor chips 200 and 300 arranged in the process described in the following.

Figure 7:
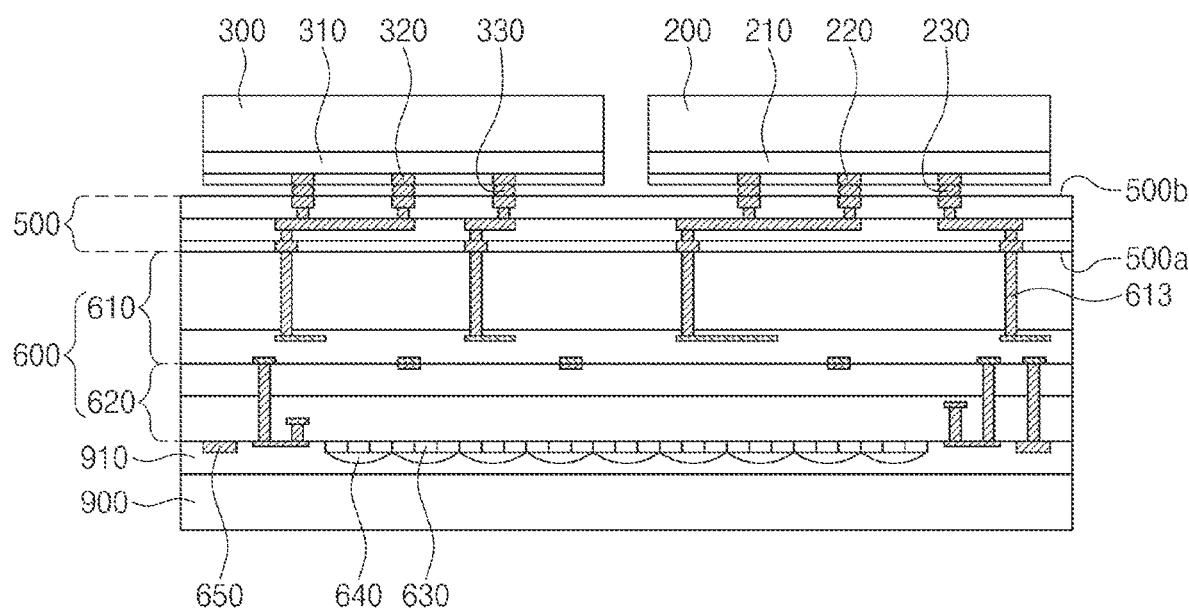

Referring to FIG. 7, the first semiconductor chip 200 and the second semiconductor chip 300 may be mounted on the redistribution layer 500. For example, the first semiconductor chip 200 and the second semiconductor chip 300 may be provided on a lower surface 500b of the redistribution layer 500. The first connection terminal 230 may be formed between the redistribution layer 500 and the first semiconductor chip 200 to electrically connect the first semiconductor chip 200 to the image sensor unit 600. The second connection terminal 330 may be located between the redistribution layer 500 and the second semiconductor chip 300 to electrically connect the second semiconductor chip 300 to the image sensor unit 600.

Figure 8:
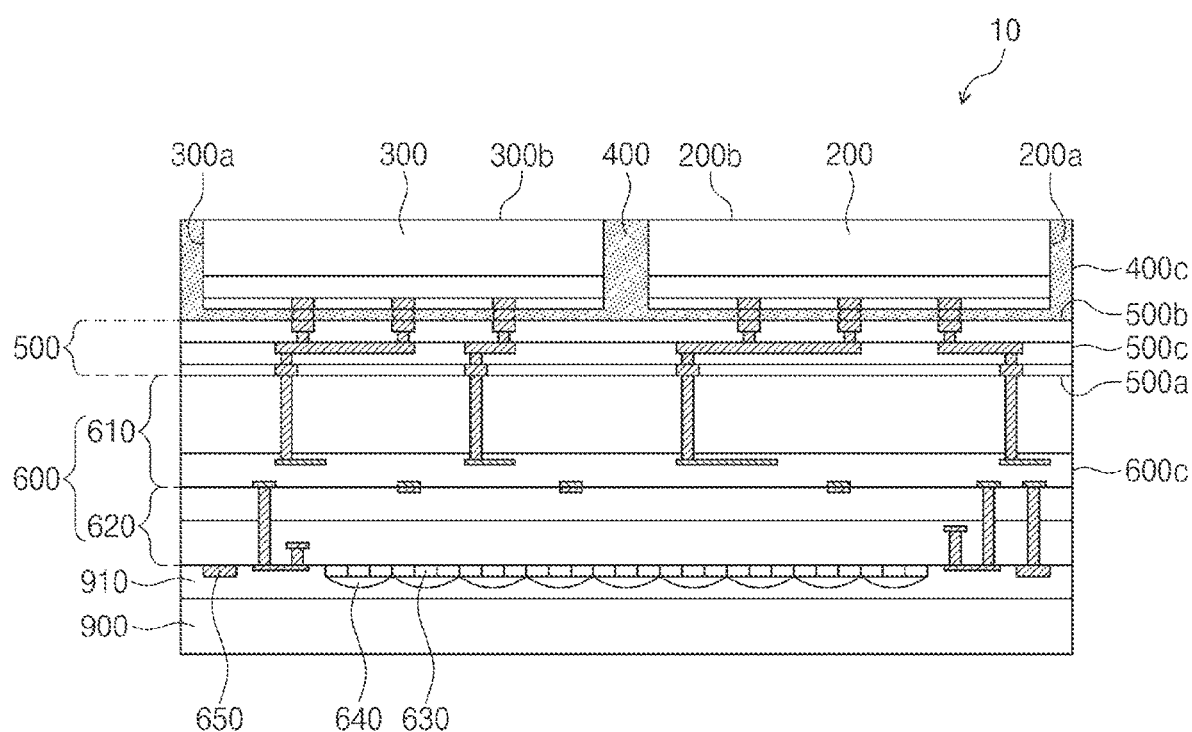

Referring to FIG. 8, the mold layer 400 may be formed on the redistribution layer 500. The mold layer 400 may cover the sides 200a and 300a of the first and second semiconductor chips 200 and 300 and the redistribution layer 500. The mold layer 400 may not cover the lower surfaces 200b and 300b of the first and second semiconductor chips 200 and 300. The side (surface) 400c of the mold layer 400 may be substantially coplanar with the side (surface) 500c of the redistribution layer 500 and the side (surface) 600c of the image sensor unit 600. A chip stack 10 may be fabricated by the aforementioned processes.

Figure 9:
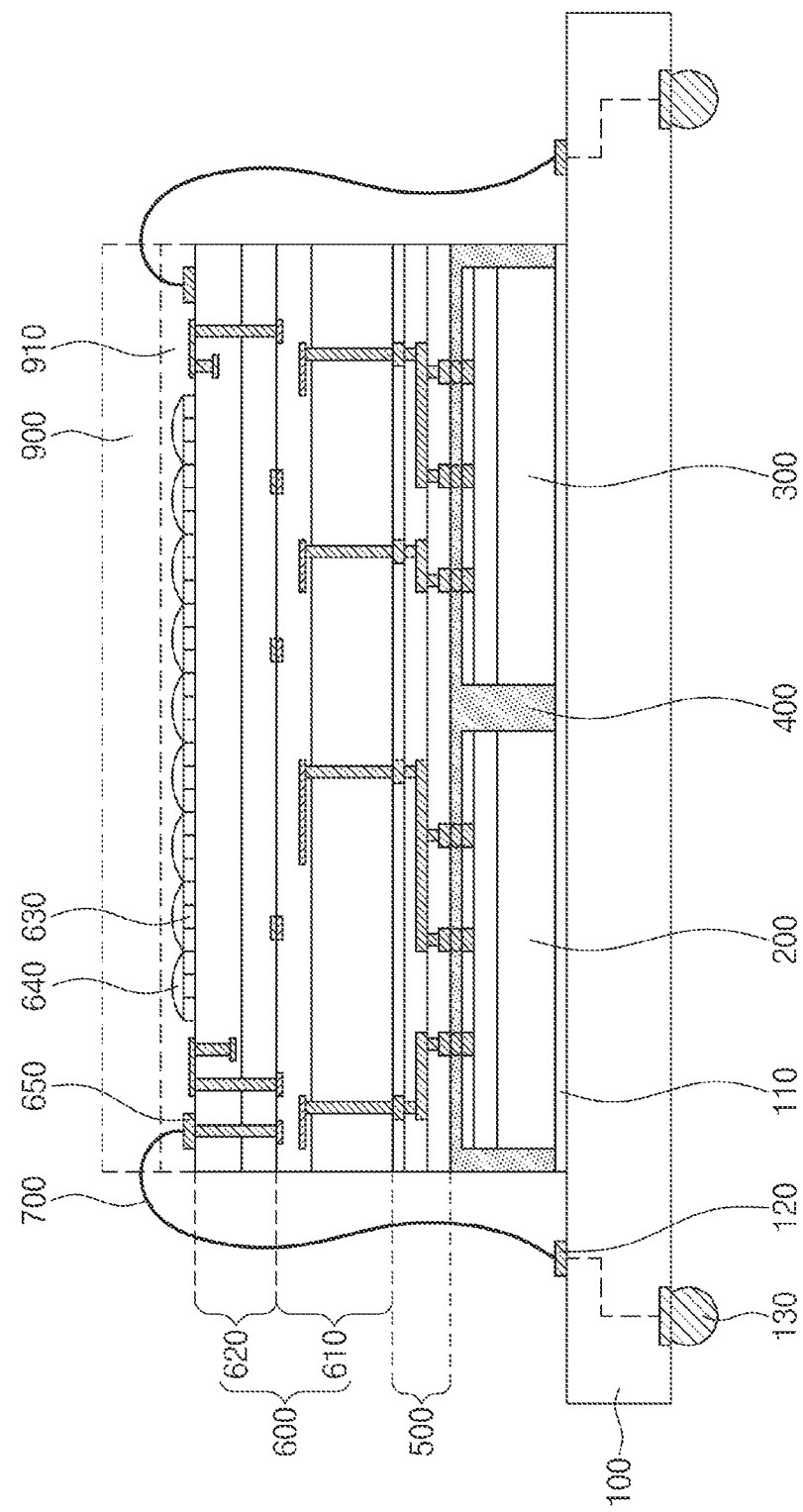

Referring to FIG. 9, after reversing the chip stack 10, the chip stack 10 may be disposed on the substrate 100 including the substrate pad 120 and an external terminal 130. At that time, the lower surface 200b of the first semiconductor chip 200 and the lower surface 300b of the second semiconductor chip 300 may face toward the substrate 100. The substrate adhesion layer 110 may be situated between the substrate 100 and the first and second semiconductor chips 200 and 300 to allow the first and second semiconductor chips 200 and 300 to be fixed on the substrate 100. The carrier substrate 900 and the carrier adhesion layer 910 may be removed, thereby exposing the color filters 630, the microlenses 640 and the connection pad 650. Thereinafter, the bonding wire 700 may be formed to connect the connection pad 650 and the substrate pad 120.

Referring to FIG. 1, the holder 810 may be provided on the substrate 100. The holder 810 may support the lens 800. The lens 800 may face and be spaced apart from the image sensor unit 600. Thus, the semiconductor package may be manufactured by the aforementioned processes.

FIGS. 10 to 14 are cross-sectional views illustrating a method of manufacturing semiconductor packages in mass according to the inventive concept. Some of the same elements and configurations as those described above will not be described again in detail, for brevity.

Referring to FIG. 10, a first semiconductor substrate 1610 and a second semiconductor substrate 1620 may be bonded to each other. A plurality of third semiconductor chips 610 may be provided in the first semiconductor substrate 1610. The first semiconductor substrate 1610 may be a semiconductor wafer substrate. A plurality of sensing chips 620 may be provided in the second semiconductor substrate 1620. The second semiconductor substrate 1620 may be a semiconductor wafer substrate. When the first and second semiconductor substrates 1610 and 1620 are bonded, the sensing chips 620 may be electrically connected to the third semiconductor chips 610, respectively. The process of forming the sensing chips 620 and the third semiconductor chips 610 and the process of bonding the first and second semiconductor substrates 1610 and 1620 may be similar to the processes of forming and bonding the sensing chip 620 and the third semiconductor chip 610 described with reference to FIG. 4.

Referring to FIG. 11, the first and second semiconductor substrates 1610 and 1620 may be inverted, and thus, the second semiconductor substrate 1620 may be provided on a carrier substrate 900. The second semiconductor substrate 1620 may be attached to the carrier substrate 900 by the carrier adhesion layer 910. The first semiconductor substrate 1610 may be located over the carrier substrate 900.

A portion of the first semiconductor substrate 1610 may be removed. For example, the first semiconductor substrate 1610 may be thinned to expose the first vias 613.

Figure 12:
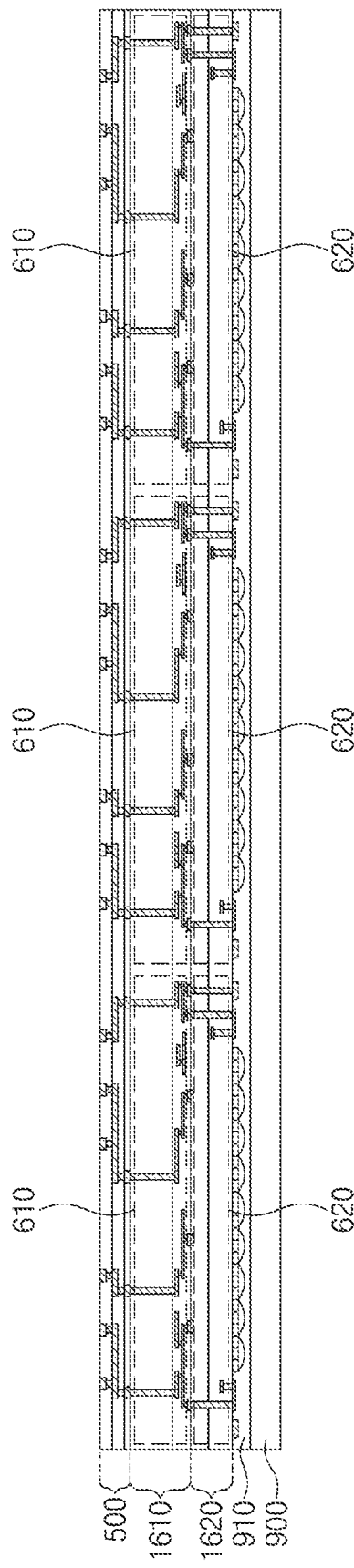

Referring to FIG. 12, the redistribution layer 500 may be formed on the first semiconductor substrate 1610 to cover the third semiconductor chips 610.

Figure 13:
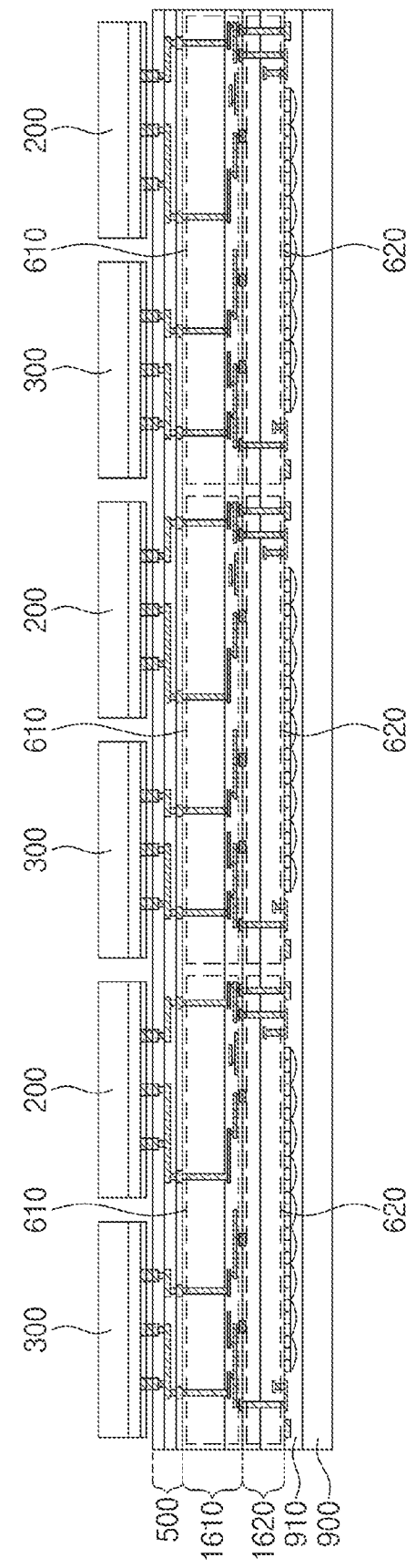

Referring to FIG. 13, the first and second semiconductor chips 200 and 300 may be mounted on the redistribution layer 500. The first and second semiconductor chips 200 and 300 may be formed by a chip-on-wafer process. For example, each of a plurality of first semiconductor chips 200 and each of a plurality of second semiconductor chips 300 may be mounted on each of the third semiconductor chips 610.

Figure 14:
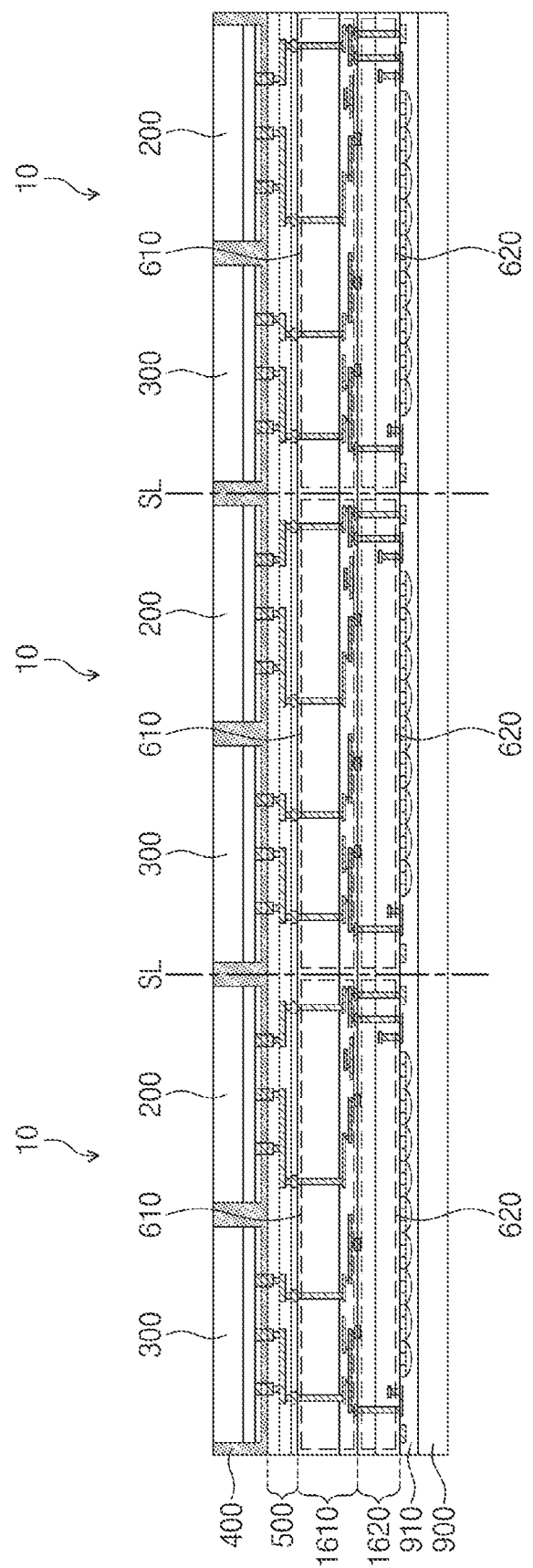

Referring to FIG. 14, a mold layer 400 may be formed on the first and second semiconductor chips 200 and 300. The mold layer 400 may be substantially the same as that described with reference to FIG. 8.

The first semiconductor substrate 1610, the second semiconductor substrate 1620 and the mold layer 400 may be sawed along a sawing line SL. Chip stacks 10 may be individually separated from each other by the sawing process. Each of the chip stacks 10 may be the same as the chip stack 10 shown in and described with reference to FIG. 8. For example, the chip stacks 10 may each include the first and second semiconductor chips 200 and 300, the mold layer 400, the third semiconductor chip 610 and the sensing chip 620. Since the chip stacks 10 are separated from one another by the sawing process, a width of the mold layer 400 may be substantially equal to a width of the redistribution layer 500 and a width of the image sensor unit 600, in each of the chip stacks 10.

Thereinafter, as described in FIG. 9, after the chip stacks 10 are mounted on a substrate 100, the holder 810 and the lens 800 may be provide on the substrate 100, thereby completing the manufacturing of the semiconductor package.

Although the inventive concept has been particularly shown and described with reference to examples thereof, it will be understood by those of ordinary skill in the art that various changes in form and details may be made to the disclosed examples without departing from the spirit and scope of the inventive concept as defined by the following claims.

What is claimed is:

1. A method of manufacturing a semiconductor package, the method comprising: aligning a first chip on a second chip so that a first active surface of the first chip faces a second active surface of the second chip; bonding the first chip and the second chip by a direct bonding process, the first active surface of the first chip and the second active surface of the second chip are in contact with each other; forming a redistribution layer on a non-active surface of the second chip to electrically connect to the redistribution layer and the second chip; mounting a third chip and a fourth chip on the redistribution layer, the third chip and the fourth chip spaced laterally apart from each other; and forming a molding layer below the redistribution layer to cover sides of the third chip and the fourth chip, wherein the first chip comprises a first bonding pad on the first active surface, and the second chip comprises a second bonding pad on the second active surface, and wherein the first bonding pad and the second bonding pad are in direct contact to electrically connect between the first chip and the second chip.

2. The method according to claim 1, wherein the process of bonding the first chip and the second chip comprising:
providing the first chip on the second chip in such a way in which the second bonding pad are aligned with the first bonding pad; and
performing a heat treatment process on the first chip and the second chip to bond the first and second bonding pads, such that the first chip and the second chip are bonded and electrically connected to each other.

3. The method according to claim 2, wherein, during the heat treatment process, an interface between the first chip and the second chip are nitrified or oxidized such that the first chip and the second chip are bonded to each other.

4. The method according to claim 1, wherein, during the mounting the third chip and the fourth chip,
   a first connection terminal is formed between the redistribution layer and the third chip to electrically connect the third chip to the second chip, and
   a second connection terminal is formed between the redistribution layer and the fourth chip to electrically connect the fourth chip to the second chip.

5. The method according to claim 1, wherein the sides of the mold layer are substantially coplanar with sides of the first chip and the second chip.

6. The method according to claim 1, wherein each of the first chip and the second chip overlaps the third chip and the fourth chip, in a plan view.

7. The method according to claim 1, further comprising:
   forming a first circuit layer, the first bonding pad on a first base layer;
   forming a first via in the first base layer; and
   providing color filters, micro-lenses and a connection pad on a non-active surface of the first chip.

8. The method according to claim 7, wherein the connection pad on a non-active surface of the first chip,
   the connection pad and a terminal of a substrate are electrically connected by a bonding wire.

9. The method according to claim 1, the second chip comprises a second via penetrating the second chip and extending to the redistribution layer from the second active surface of the second chip, and
   wherein the second via electrically connected the redistribution layer and the second active surface of the second chip.

10. The method according to claim 1, wherein each of the third chip and the fourth chip has an active surface facing toward the second chip and electrically connected to the redistribution layer.

11. The method according to claim 1, wherein the first chip and the second chip constitute an image sensor unit,
   the second chip comprises a logic chip, and
   the first chip comprises a photo diode.

12. The method according to claim 1, wherein the third chip is a memory chip, and
   the fourth chip is a dummy chip consisting of a single layer of silicon or metal.

13. A method of manufacturing a semiconductor package, the method comprising:
   forming a first semiconductor chip in a first semiconductor substrate;
   forming a second semiconductor chip in a second semiconductor substrate;
   bonding the first semiconductor substrate on the second semiconductor substrate to electrically connect the first semiconductor chip and the second semiconductor chip;
   exposing a via of the second semiconductor chip on a bottom surface of the second semiconductor substrate;
   forming a redistribution layer below the second semiconductor substrates to electrically connect to the via;
   mounting a third semiconductor chip and a fourth semiconductor chip spaced laterally apart from each other on the redistribution layer;
   forming a molding layer below the redistribution layer to surround the third semiconductor chip and the fourth semiconductor chip; and
   sawing the first semiconductor substrate, the second semiconductor substrate and the molding layer,
   wherein the first semiconductor chip comprises a first bonding pad on a first active surface of the first semiconductor chip, and the second semiconductor chip comprises a second bonding pad on a second active surface of the second semiconductor chip, and
   wherein the first bonding pad and the second bonding pad are in direct contact to electrically connect between the first semiconductor chip and the second semiconductor chip.

14. The method according to claim 13, wherein, after sawing process, sides of the mold layer are substantially coplanar with sides of the first semiconductor chip and the second semiconductor chip.

15. The method according to claim 13, wherein a sum of widths of the third and fourth semiconductor chips is smaller than a width of the first semiconductor chip and a width of the second semiconductor chip.

16. The method according to claim 13, wherein
   the first semiconductor chip comprises a photo diode,
   the second semiconductor chip comprises a logic chip,
   the third semiconductor chip is a memory chip, and
   the fourth semiconductor chip is a dummy chip consisting of a single layer of silicon or metal.

17. The method according to claim 13,
   wherein the first semiconductor chip comprises:
      a first base layer;
      a first circuit layer disposed on the first base layer and comprises integrated circuits; and
      the first bonding pad on the first circuit layer,
   wherein the second semiconductor chip comprises:
      a second base layer; and
      a second circuit layer disposed on the second base layer and comprises integrated circuits; and
      the second bonding pad on the second circuit layer,
   wherein the first circuit layer and the second circuit layer are contact to connect the first and second bonding pads.

18. The method according to claim 13, wherein bonding the first semiconductor substrate on the second semiconductor substrate comprising:
   providing the first semiconductor substrate on the second semiconductor substrate in such a way in which the second bonding pad are aligned with the first bonding pad; and
   performing a heat treatment process on the first semiconductor substrate and the second semiconductor substrate to bond the first and second bonding pads, such that the first semiconductor chip and the second semiconductor chip are bonded and electrically connected to each other.

19. The method according to claim 13, wherein, during the mounting a third semiconductor chip and the fourth semiconductor chip,
   a first connection terminal is formed between the redistribution layer and the third semiconductor chip to electrically connect the third semiconductor chip to the second semiconductor chip, and
   a second connection terminal is formed between the redistribution layer and the fourth semiconductor chip to electrically connect the fourth semiconductor chip to the second semiconductor chip.

20. The method according to claim 13, wherein each of the first semiconductor chip and the second semiconductor chip overlaps the third semiconductor chip and the fourth semiconductor chip, in a plan view.

* * * * *